(12) United States Patent
Eberlein et al.

(10) Patent No.: US 7,468,606 B2
(45) Date of Patent: Dec. 23, 2008

(54) VACUUM HOUSING FOR A MAGNETIC RESONANCE APPARATUS

(75) Inventors: Eva Eberlein, Baiersdorf (DE); Johann Schuster, Oberasbach (DE); Stefan Stocker, Großenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 172 days.

(21) Appl. No.: 10/587,670

(22) PCT Filed: Jan. 17, 2005

(86) PCT No.: PCT/EP2005/050172

§ 371 (c)(1),
(2), (4) Date: Jul. 27, 2006

(87) PCT Pub. No.: WO2005/073988

PCT Pub. Date: Aug. 11, 2005

(65) Prior Publication Data

US 2007/0164725 A1 Jul. 19, 2007

(30) Foreign Application Priority Data

Jan. 28, 2004 (DE) .................... 10 2004 004 294

(51) Int. Cl.
*G01V 3/00* (2006.01)

(52) U.S. Cl. ...................................... 324/319; 324/320

(58) Field of Classification Search ................. 324/319, 324/320; 335/216; 62/51.1, 48.1
See application file for complete search history.

(56) References Cited

U.S. PATENT DOCUMENTS

| 4,625,192 | A | * | 11/1986 | Kawaguchi | .................. 335/216 |
| 4,986,078 | A | * | 1/1991 | Laskaris | ..................... 62/51.1 |
| 5,265,430 | A | * | 11/1993 | Chen et al. | .................... 62/48.1 |
| 5,369,387 | A | | 11/1994 | Woods et al. | |
| 5,657,634 | A | * | 8/1997 | Woods | ........................ 62/51.1 |
| 5,868,876 | A | | 2/1999 | Bianco et al. | |
| 6,043,653 | A | * | 3/2000 | Takamori et al. | ............ 324/309 |

FOREIGN PATENT DOCUMENTS

EP    1 193 507 A2    4/2002

* cited by examiner

*Primary Examiner*—Louis M Arana

(57) ABSTRACT

Disclosed is a vacuum housing for a magnetic resonance apparatus having a recess for leading through lead wires to elements located inside the vacuum housing, and a first lead-through bushing module. The first lead-through bushing module is provided with a first closing plate which is configured so as to vacuum-tightly seal the recess along with a second closing plate. The first bushing module is also provided with a first structural component that is to be at least partially led through the recess during assembly of the lead-through bushing module and whose size defines a minimum size of the recess, which is greater than the size of the first closing plate.

7 Claims, 2 Drawing Sheets

VACUUM HOUSING FOR A MAGNETIC RESONANCE APPARATUS

CROSS REFERENCE TO RELATED APPLICATIONS

This application is the U.S. National Stage of International Application No. PCT/EP2005/050172, filed Jan. 17, 2005 and claims the benefit thereof. The International Application claims the benefits of German application No. 10 2004 004 294.2 DE filed Jan. 28, 2064, both of the applications are incorporated by reference herein in their entirety.

FIELD OF INVENTION

The invention relates to a vacuum housing for a magnetic resonance apparatus with a recess for leading through lead wires to elements inside the vacuum housing and with at least one first lead-through module.

BACKGROUND OF INVENTION

One approach to suppressing the noise generated during the operation of a magnetic resonance apparatus (MR apparatus) is to surround the largest possible part of the vibrating surfaces of the MR apparatus with a vacuum. To this end the MR apparatus is for example enclosed in an air-tight casing, where the pressure is approx. 100 mbar. The evacuation of the encased hollow space causes the sound to be decoupled between the vibrating surfaces and the outer wall of the vacuum casing. The problem then arises of the air-tight leading through of lead wires into the inside of the vacuum housing. The lead-throughs for bulky power lines from encased gradient coils and the associated cooling circuit are particularly complex. The high current intensities mean that rigid and correspondingly bulky supply lines are used with large conductor diameters for example. Further example of possible lead wires are electric service lines, e.g. for low-level signals for temperature measurement or control currents, which flow with current intensities of up to 5 mA in controllable magnetic field coils within the vacuum casing.

SUMMARY OF INVENTION

The object of the invention is to specify a vacuum housing for a magnetic resonance apparatus, which allows bulky lead wires to be led through to elements inside the vacuum housing.

The object relating to the vacuum housing mentioned in the introduction is achieved in that the first lead-through module has a first cover plate, which is configured such that, together with at least one second cover plate, it seals the recess in a vacuum-tight manner and that the first lead-through module has a first structural component, which is to be led through the recess at least partially during assembly of the lead-through module and whose dimensions define the minimum size of the recess, which is greater than that of the first cover plate.

One advantage of the vacuum housing according to the invention is that it simplifies the leading through under a vacuum of bulky structural components, in that it decouples the size of the recess required by the dimensions of the first structural component from the size of the cover plate assigned to the first structural component. On the one hand this makes it simpler to handle, e.g. fit or change, bulky structural components, without on the other hand adversely affecting the geometry of the vacuum housing.

One example of a bulky structural component is a gradient line for example, on which significant forces act due to the large currents in the magnetic field. As a result it is very rigid and stable. The gradient line connects a gradient coil via the lead-through module to an electric contact of a power supply, arranged outside the vacuum chamber. It can have a length of more than 1 m and its form is tailored to the spatial conditions. For example it can run along a radial line from the lead-through module to the gradient coil within the vacuum chamber, while outside the vacuum chamber its form is such that it can be connected to a contact even if said contact is arranged at a different azimuthal angle. Being a largely inflexible line, it has dimensions that make it difficult to handle. With the aid of the invention it can be fitted or removed easily.

In a particularly advantageous development of the vacuum housing the second cover plate is part of a second lead-through module. This has the advantage that the size of the recess, as required due to the structural components to feed lead wires in and out through the recess, can be used for further lead wires to elements inside the vacuum housing.

In a particularly advantageous development, the second lead-through module comprises a drawer-type lead unit. This makes it possible to lead for example a high-frequency, temperature signal line and/or a shim control line such that the electric line can be connected electrically to a plug connector for example, having been led even to a region that is difficult to access due to the geometry of the MR apparatus and being inspected there.

Further advantageous embodiments of the invention are characterized by the features of the dependent claims.

BRIEF DESCRIPTION OF THE DRAWINGS

An exemplary embodiment is described below with reference to FIGS. 1 and 2, in which.

DETAILED DESCRIPTION OF INVENTION

Figure 1:
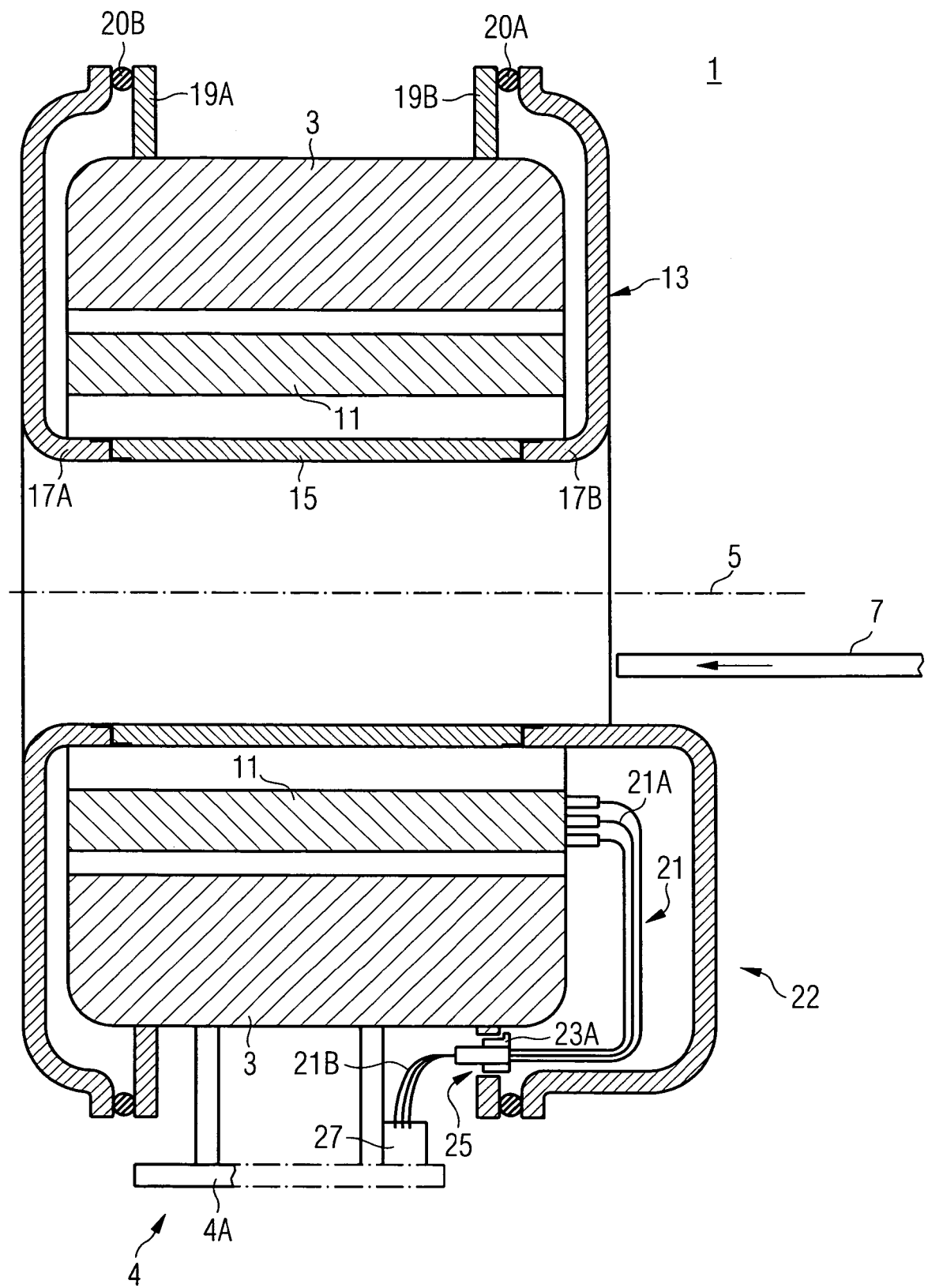
FIG. 1 shows a vertical section through the front region of a magnetic resonance apparatus with a cylindrical basic field magnet along the cylinder axis and FIG. 2 shows a perspective view of a section of the vacuum housing, in which a recess with two lead-through modules can be sealed.

FIG. 1 shows a schematic diagram of a section through a magnetic resonance apparatus 1 with a cylindrical basic field magnet 3. The magnetic resonance apparatus 1 is fixed to the ground using a stable mount 4, which for example comprises two parallel supports 4A. The principal magnetic axis 5 corresponds to the axis of symmetry of the cylinder of the basic field magnet 3. A patient can be inserted into the examination area 9 of the magnetic resonance apparatus 1 with the aid of a patient support 7. Large magnetic fields are required in the examination area 9 for the magnetic resonance examination. These are modified by gradient magnetic fields from the gradient coil units 11 to allow imaging with local resolution. The strength of the basic magnetic field, the gradient current intensity and the ramp time of the gradient currents are of significance for image quality.

Because of the large currents in the gradient coils 11 in the prevailing magnetic field of the basic field magnets 3, strong Lorenz forces act on the respective gradient coils and cause vibrations, which result in greater noise emissions.

For the purposes of noise suppression, the vibrating system components are insulated acoustically from the examination area 9 with the aid of a vacuum housing 13, which essentially encloses the basic field magnet 3 and the gradient coil units 11 completely. The vacuum housing 13 comprises a central region 15, rear and front annular cladding 17A, 17B and two annular sealing plates 19A, 19B, which are attached in a vacuum-tight manner to the basic field magnet 3. The detachable parts of the vacuum housing 13 are attached in a vacuum-tight manner using sealing rings 20A, 20B. The volume enclosed by the vacuum housing 13 is for example evacuated to a pressure of 100 mbar. This causes the acoustic decoupling of the vacuum housing 13 and thus the examination area 9 from the vibrating components within the vacuum housing. In an alternative advantageous embodiment of the vacuum housing 13, the central part, the rear front plate 17A and the sealing ring 19A can be executed as single piece.

With such an MR apparatus 1 a wide range of wires have to be led into the inside of the vacuum housing:
- Gradient lead wires to gradient coils to generate variable and non-homogeneous magnetic fields by means of controlled current pulses of several hundred amps,
- Body coil signal lines to send and receive high-frequency pulses,
- Cooling lines to remove dissipative power of for example up to 20 kW due to resistive losses in the gradient coils,
- Low-level signal lines, for example, to measure temperature with the aid of NTCs,
- Control power lines to adjust the basic magnetic field characteristics to the conditions at the time of measurement (shim control currents).

FIG. 1 for example shows three rigid gradient lines 21 for the three spatial directions, in which gradient magnetic fields are to be generated. They have a section 21A in the vacuum and a section 21B running outside the vacuum housing. These have to be configured in a stable manner because of the forces acting on the gradient lines due to the strong magnetic field and the very large currents. The gradient lines are therefore rigid and bulky to handle when fitting and removing. In one possible embodiment, similar to the coaxial line, they are for example realized with wires with a diameter of 15 mm, running in an insulated manner in copper tubes of for example approx. 22 mm diameter. The large currents require such a diameter. The stable and therefore bulky structure of the gradient lines 21 is not restricted to the region within the vacuum housing, as large magnetic fields are also present outside the vacuum housing, below the basic field magnet in the instance shown in FIG. 1.

To accommodate the bulky gradient lines 21, in FIG. 1 the front plate 17B has a scoop-like shape in the region of the patient support 7. To restrict access to the examination area 9 as little as possible, the lead wires to the gradient coils were arranged in the region of the entry point of the patient support 7. This scoop arrangement also has the advantage that the increased space required for the vacuum casing is kept as small as possible.

Use of the vacuum housing 13 requires simple maintenance and replacement of the lead-through lines even in restricted spatial conditions. According to the invention, the lead wires, for example the gradient lines 21 with the lead-through module 23, can be removed completely for service purposes, even in restricted spatial conditions, without having to lift the magnet for example. The gradient line 21A thus represents a component, which has to be led through the recess 25 during assembly of the lead-through module 23A and whose dimensions predetermine the minimum size of the recess 25, which is larger than that of a cover plate 31A of the lead-through module 23A.

Figure 2:
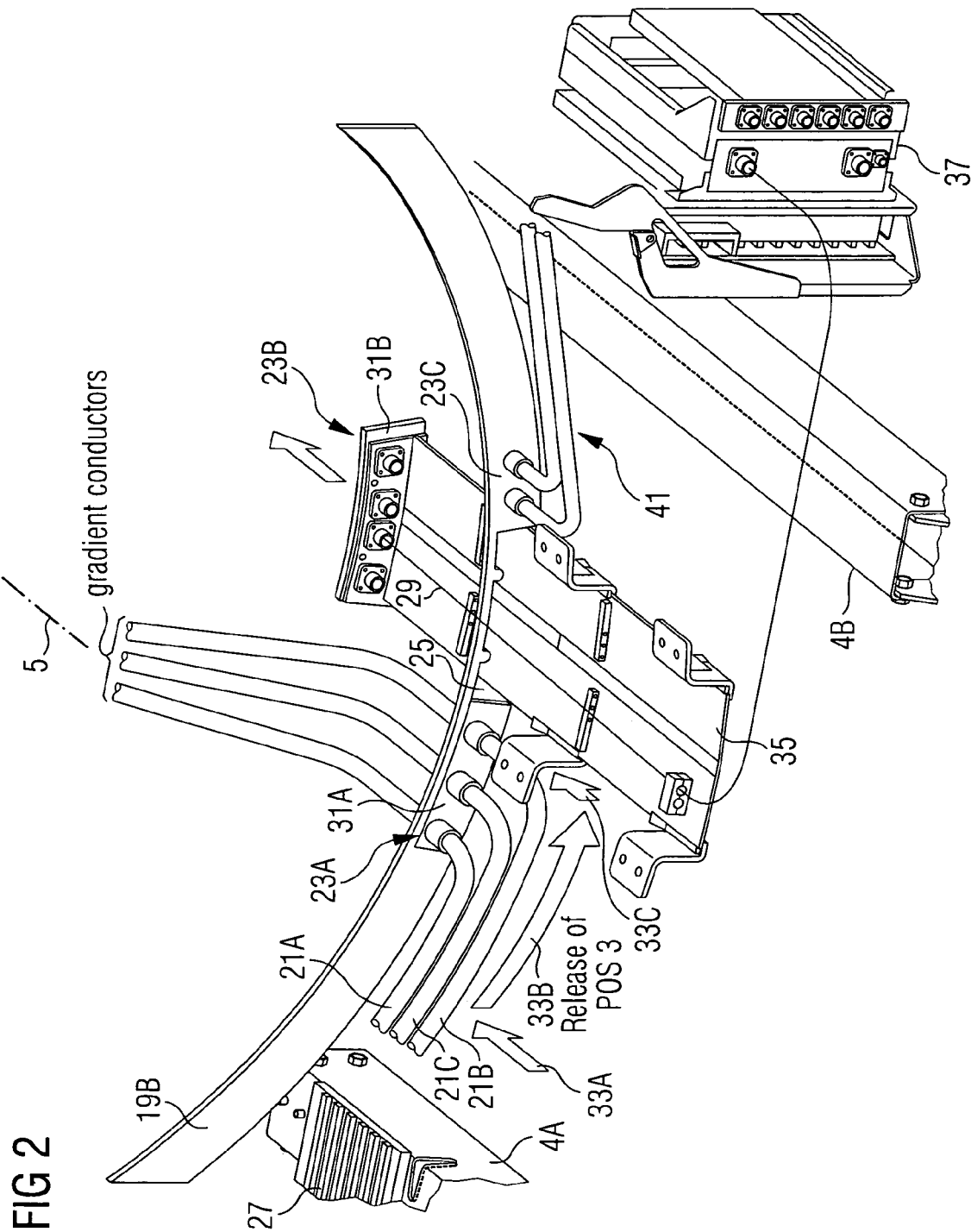

FIG. 2 shows a perspective view of the front sealing plate 19B in the region of the lead-through modules 23A, 23B, which are arranged low down in the recess 25 in the sealing plate 19B. A viewing direction from the examination area 9 out to the recess 25 was selected for this. For a free view of the lead-through modules 23A, 23B, the gradient coils 11, the field magnet 3 and the vacuum housing 13 (with the exception of the sealing plate 19B) are not shown.

FIG. 2 shows the two parallel supports 4A, 4B on which the basic field magnet 3 rests. A contact unit 27 for the gradient lines 21A, ..., 21C is arranged on the support 4A.

The gradient lines 21A, ..., 21C and low-level signal lines 29 are pre-mounted in a vacuum-tight manner on the cover plates 31A, 31B. The lines 21, 29, together with the cover plates 31A, 31B, form the lead-through modules 23A, 23B, which together seal the recess 25 in a vacuum-tight manner. They are for example screwed onto the sealing plate 19B in a vacuum-sealed manner to this end.

Because a number of lead-through modules 23A, 23B seal the recess 25 together, it is possible to fit or remove even the very rigid configuration of the lead-through module 23A through the recess. Gradient lines 21 can be changed as follows by way of example:

Once the front plate 17B has been removed, the low-level signal lines, which are positioned with the aid of the lead-through module 23D, are disconnected and the lead-through module 23B is removed in the direction of the arrow. The gradient lines 21 are also disconnected from the gradient coil 11 and from the contact unit 27. The lead-through module 23A is then removed completely by rotating about the principal magnet axis 5, by pulling and in some instances by tilting. This is possible, as according to the invention the size of the recess is tailored to the dimensions of the bulky gradient lines 21B. This procedure is shown by the arrows 33A, ..., 33C in FIG. 2.

A particular feature of the lead-through module 23D is a drawer-type structure 35, which in the assembled state projects into the inaccessible region below the basic field magnets 3. It makes it possible for example to lead in signal input lines advantageously, such that they can be connected easily to corresponding electronic units 37. The drawer-type structure 35 is led for example through lead-throughs 39A, 39C, which are attached to the basic field magnet 3.

Alternatively the low-level signal lines 29 can for example be led through tubes, which serve to lead the lines, to the corresponding components 37. If the lead-through module 23B is removed for example, the lines 29 run through the lead tubes and can be unscrewed on the rear of the cover plate. If both connections are opened with the ends of the one of the lines 29, said line can be drawn through the lead tube running below the magnets 3 for example and be reinserted or changed after a service inspection.

As shown schematically in FIG. 2, a larger recess can also be sealed in a vacuum-tight manner by more than two lead-through modules 23A, 23B. To illustrate this, FIG. 2 shows an exemplary third lead-through module 23C with a broken edge. The lead-through module 23C can be used for example to lead through cooling lines 41.

The invention claimed is:

1. A vacuum housing for a magnetic resonance apparatus comprising:
   a recess configured to receive lead wires for leading the lead wires to elements inside the vacuum housing; and
   a first lead-through module comprising:
      a first cover plate which is configured to seal the recess in a vacuum-tight manner together with at least a second cover plate, and
      a first structural component connected with the first cover plate, the first structural component being configured to be led at least partially through the recess during assembly of the lead-through module, wherein the first structural component has dimensions that define the minimum size of the recess required for assembly and wherein the recess has a minimum size greater than that of the first cover plate.

2. The vacuum housing for a magnetic resonance apparatus of claim 1, wherein the first structural component comprises an inflexible gradient line.

3. The vacuum housing for a magnetic resonance apparatus of claim 1, further comprising a second lead-through module having the second cover plate.

4. The vacuum housing for a magnetic resonance apparatus of claim 3, wherein the second lead-through module further comprises a drawer-type lead unit, which is configured in particular to lead a high-frequency, temperature signal line.

5. The vacuum housing for a magnetic resonance apparatus of claim 3, wherein the second lead-through module further comprises a drawer-type lead unit, which is configured in particular to lead a shim control line.

6. The vacuum housing for a magnetic resonance apparatus of claim 1, wherein the recess is arranged in a lower portion of the vacuum housing.

7. The vacuum housing for a magnetic resonance apparatus of claim 1, wherein the vacuum housing is configured outward in the region of the recess in the form of a scoop to create a cavity to accommodate the lead wires.

* * * * *